United States Patent [19]

Kwasnick et al.

[11] Patent Number: 5,663,577
[45] Date of Patent: Sep. 2, 1997

[54] SOLID STATE IMAGER ARRAY WITH ADDRESS LINE SPACER STRUCTURE

[75] Inventors: Robert Forrest Kwasnick, Niskayuna; Jianqiang Liu, Clifton Park, both of N.Y.

[73] Assignee: General Electric Company, Schenectady, N.Y.

[21] Appl. No.: 609,436

[22] Filed: Mar. 1, 1996

[51] Int. Cl.$^6$ .................................................. H01L 31/00
[52] U.S. Cl. .......................... 257/59; 257/72; 257/291; 257/292; 257/443; 257/446
[58] Field of Search ........................... 257/59, 72, 292, 257/291, 443, 446

[56] References Cited

U.S. PATENT DOCUMENTS

| | | | |
|---|---|---|---|
| 4,780,394 | 10/1988 | Blanchard et al. | 257/291 X |
| 4,889,983 | 12/1989 | Numano et al. | 257/292 X |
| 5,399,884 | 3/1995 | Wei et al. | 257/59 |
| 5,475,246 | 12/1995 | Wei et al. | 257/59 X |
| 5,480,810 | 1/1996 | Wei et al. | 437/2 |
| 5,483,082 | 1/1996 | Takizawa et al. | 257/59 |
| 5,498,573 | 3/1996 | Whetten | 437/192 |

*Primary Examiner*—William Mintel
*Attorney, Agent, or Firm*—Donald S. Ingraham

[57] ABSTRACT

A solid state imager is provided that has a robust, high integrity upper barrier layer disposed over photosensor pixels and data address line topography in the imager. Data address line spacers disposed between the sidewalls of the data address lines and the upper barrier layer provide an inclined foundation for the upper barrier layer in the vicinity of the data address line sidewalls, thereby providing barrier layer high integrity step segments in the region of the steps around relatively thick data address lines. The address line spacers are formed from residual photosensor semiconductive material, typically amorphous silicon, which remains following the etching steps to form deposited photosensitive semiconductive material into the pixel photosensor bodies. The spacers are typically disposed in a position corresponding to the region around the corner of the data line sidewall and the underlying material of the array, and extend along the length of the data address lines and portions of the data address lines comprising the coupling to respective pixel photosensor switching devices coupled to the address line.

10 Claims, 2 Drawing Sheets

SOLID STATE IMAGER ARRAY WITH ADDRESS LINE SPACER STRUCTURE

This invention relates generally to large area solid state imager devices and specifically to address line structures and the robustness of layers of material disposed over the address lines in such devices.

Solid state imaging devices can be used for detection of incident radiation. Such imager devices typically comprise an array of pixels with an associated matrix of rows and columns of address lines to electrically access each pixel. Each pixel has a photosensor and a switching device, typically a transistor such as a thin film transistor (TFT), or the like. For example, the gate electrode of the TFT is coupled to a scan line and the source electrode (or alternatively, the drain electrode) of the TFT is coupled to a data line. The TFTs coupled to a scan line can each be made conductive by an electrical signal applied to the respective gate electrodes; the photosensor charge from each pixel coupled to those TFTs can then be read from respective data lines coupled to the TFTs.

In imagers used for medical diagnostic use, it is desirable that as little radiation exposure as possible be given to the patient. Reduced radiation flux for imaging results in correspondingly smaller amounts of charge being collected at the photosensor pixels that corresponds to the image, and thus such an imager device needs to be constructed so as to provide low electrical noise operation. To provide low noise operation, the data lines used for read out of the relatively minute amounts of charge collected in each photosensor are typically relatively thick; that is, the amount of conductive material forming the data line is thicker than, for example, the scan lines in the device (e.g., the data lines typically have a thickness in the range between 0.5 μm and 1, whereas the scan lines typically have a maximum thickness of about 0.5 μm). The thick data lines are desirable to reduce Johnson noise associated with high resistance readout lines, which problem is of particular significance in large area imagers (e.g., having an area of about 100 cm² or more). Many fabrication processes, such as wet etching to form the data lines, leave a data line structure with steep sidewalls (that is, close to vertical sidewalls) that rise up to a relatively flat upper surface.

The various components in an imager device are formed in layers on a substrate such that components are sandwiched within the completed structure. For example, scan lines and data lines are disposed at different layers in the device with dielectric material in between to provide the necessary electrical isolation and connection to TFT electrodes. Dielectric material and semiconductive material are deposited to form the TFTs and photosensors; a barrier layer (also called a diode passivation layer) of dielectric material is also deposited over the photosensors, data lines, and switching transistors to protect and electrically insulate these components from overlying conductive components in the array, such as an array common electrode. The dielectric material of the barrier layer must have a high level of structural integrity to provide effective electrical insulation, because defects in the barrier layer that allow electrical leakage between components can seriously degrade imager performance by introducing noise that degrades performance of imagers used in medical diagnostic imaging. Often the points at which the barrier layer (or diode passivation layer) is disposed over the steep sidewalls of the relatively thick data lines are high stress areas in which structural degradation of the barrier layer can result in undesired electrical leakage through the barrier layer, resulting in higher noise or greater number defective pixels in the array.

SUMMARY OF THE INVENTION

In accordance with this invention, a solid state imager is provided that has a robust upper barrier layer disposed over photosensor pixels and a plurality of data address lines disposed in the imager, with data address line spacers disposed between the sidewalls of the data address lines and the upper barrier layer so as to provide an inclined foundation for the upper barrier layer in the vicinity of the data address line sidewalls. The address line spacers comprise residual photosensor semiconductive material, typically amorphous silicon. The residual photosensor semiconductive material typically comprise layers of semiconductive material, such as a doped silicon layer and a substantially intrinsic amorphous silicon layer. The spacers are typically disposed in a position corresponding to the region adjacent to the corner of the data line sidewall and the underlying material of the array, and extend along the length of the data address lines and portions of the data address lines comprising the coupling to respective pixel photosensor switching devices coupled to the address line.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
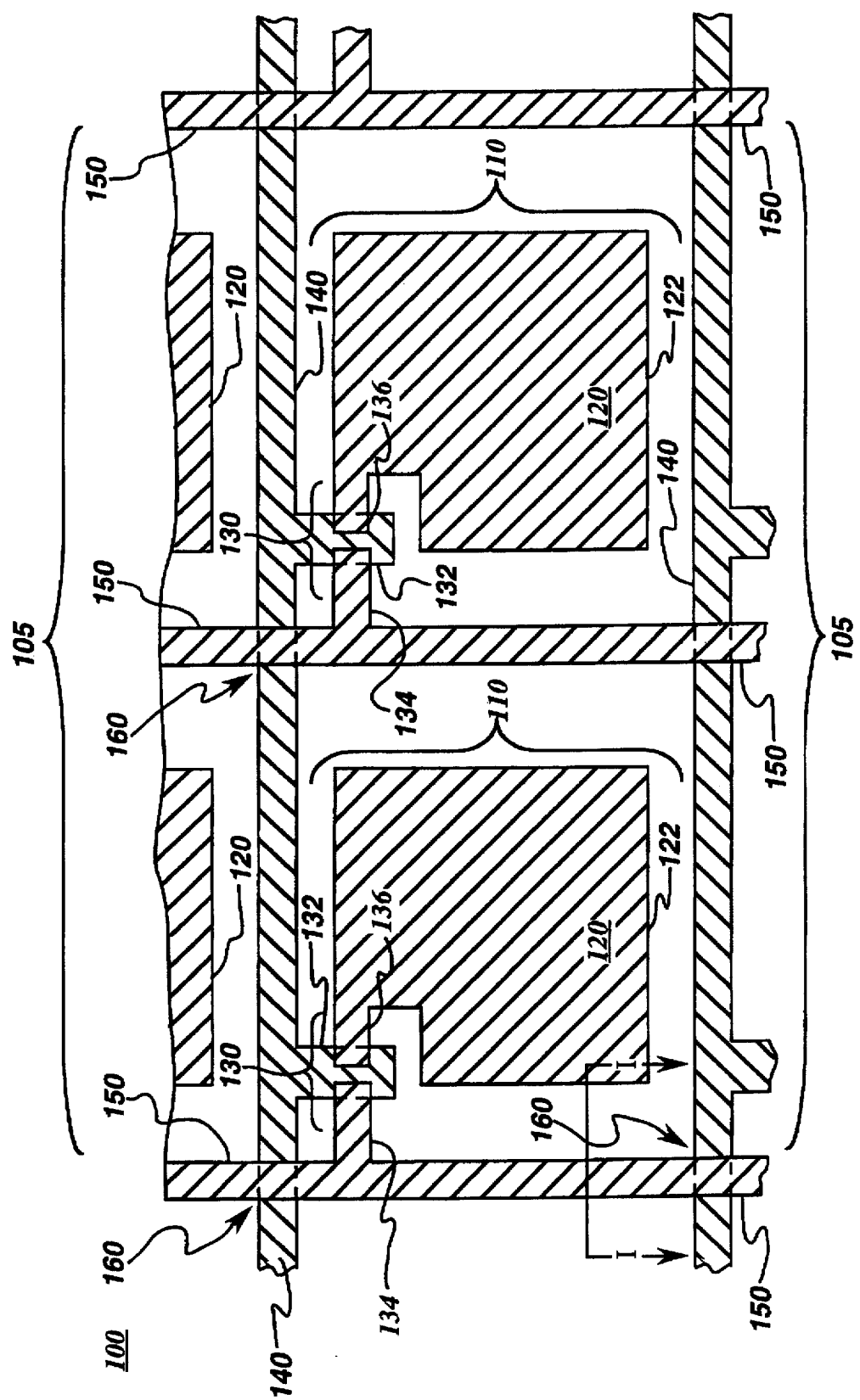
FIG. 1 is a plan view of a portion of an imager having a pixel array in accordance with the present invention.

A solid state imager 100, such as a radiation imager for detecting electromagnetic radiation such as x-rays or the like, comprises a plurality of pixels 110 (representative ones of which are illustrated in FIG. 1A) and a plurality of first address lines 140 and a plurality of second address lines 150 that are coupled to respective ones of pixels 110, as illustrated in FIG. 1. As described herein, first address lines 140 comprise scan lines in imager 100, and second address lines 150 comprise the data lines in imager 100; although the spacer devices of the present invention are described in the context of data address lines, the present invention is applicable in thin film imager or display device structures regardless of the address line nomenclature used or the specific electrical connections of such address lines.

Each pixel 110 comprises a respective photosensor 120 (typically a photodiode, as described herein) and a switching device 130, such as a thin film field effect transistor (FET) (also referred to as TFTs) or the like. In imager 100, scan address lines 140 are each coupled to a gate electrode 132 of FET 130; signals on these lines are used to cause the FET to become conductive or non-conductive. Data address lines 150 are each coupled to respective drain electrodes 134 of FETs 130; a source electrode 136 of each FET 130 is coupled to a bottom electrode 122 of the respective pixel photosensor 120. Typically source electrode 136 and bottom electrode 122 comprise one contiguous portion of conductive material. It is noted that, as FET 130 is used as a switching device, the designation of one electrode of FET as the source electrode and one electrode as the drain electrode does not imply any limitations on device operation or electrical performance.

Scan lines 140 and data lines 150 are disposed in the array along axes that are substantially perpendicular to one another so as to form a matrix arrangement. Scan lines 140 and data lines 150 are disposed at different layers in imager 100 such that data lines 150 overlie scan lines at each pixel in a crossover region 160. Imager 100 thus comprises a plurality of pixels 110 disposed in a pixel array 105 in which respective data lines 150 are coupled to photosensor pixels disposed along the respective data line and thereby define columns of pixels and respective scan lines 140 are coupled to photosensor pixels disposed along the respective scan line and thereby define rows of pixels.

Imager 100 comprises a substrate 107 (FIG. 2), comprising glass or the like, on which scan lines 140 (FIG. 1) are disposed. Scan address line 140 typically comprises a conductive material such as aluminum, titanium, molybdenum, or the like, and has a thickness in the range between about 0.1 μm and 0.5 μm. A gate dielectric layer 135 (FIG. 2) is disposed across the array so as to electrically insulate scan lines 140 and gate electrodes 132 (FIG. 1 ) from other array components. Gate dielectric layer 135 (FIG. 2) typically has a thickness in the range between about 0.3 μm and 0.5 μm and comprises an inorganic dielectric material such as silicon oxide, silicon nitride, or silicon oxy-nitride, but may alternatively comprise polyimide or similar polymer.

In the imager fabrication process, after deposition of gate dielectric layer 135, a FET semiconductive material layer 137 (e.g., substantially intrinsic amorphous silicon and doped semiconductive material such as n+ doped silicon) (for ease of illustration, shown as one layer in FIG. 2) are deposited over gate dielectric layer 135 and then patterned in order to form the channel region (not shown in FIG. 2) of FET 130. As used herein, "patterned" and the like refers to photolithographic techniques or the like for obtaining a desired pattern of material disposed on the array. Such techniques include patterning of one specific layer of material in the array, or alternatively patterning more than one underlying layer in one process. The semiconductive material typically has a thickness in the range between about 0.05 μm and 0.5 μm. In one embodiment of imager 100, portions of the semiconductive and doped semiconductive materials 137 may remain disposed over gate dielectric layer 135 in regions of the array such as where conductive material is deposited to form data address lines 150, FET 130 source and drain electrodes, photodiode bottom contact electrode 122. In another embodiment of imager 100, the patterning process to form FET 130 results in removal of the semiconductive and doped semiconductive materials from the region of the imager shown in cross section in FIG. 2 (not illustrated). The present invention as described below is equally applicable to either embodiment.

After the semiconductive material has been deposited and patterned, fabrication of the imager continues with the deposition and patterning of a source-drain metal layer which is patterned to form source and drain electrodes 136, 134, data lines 150, and typically photosensor bottom contact electrode 122 (FIG. 1 ). Data address lines 150 typically comprise a conductive material such as molybdenum, chromium, or the like, and have a thickness in the range of about 0.5 μm to about 1 μm. Patterning of the metal to form data lines is commonly done in a wet etching process, which process produces steep sidewall segments 152 that are substantially vertical. As used herein, "substantially vertical" and the like refers to sidewall segments that have a slope within about 30° of vertical with respect to the underlying material on which the data line is deposited. A FET passivation layer 139 is then deposited over the array and patterned such that it is removed from upper portions of photodiode bottom electrode 122, but remains disposed over data address lines 150 and FETs 130.

Photosensors 120 are then formed by the deposition and patterning of layers of doped and intrinsic photosensitive material, typically silicon, to comprise, for example, a photodiode body 125 (FIG. 2) disposed over bottom contact electrode 122. Typically, photodiode body comprises bottom contact 122 on which a first layer of doped semiconductor material 124 is disposed; a layer of semiconductive material 126, and a second layer of doped semiconductor material 128. The three semiconductive layers typically comprise n+ doped silicon (layer 124), (substantially intrinsic amorphous silicon (i-Si) (layer 126), and p+ doped silicon (layer 128) (e.g., a p-i-n diode structure).

The photosensitive material deposited to form photosensors 120 typically is deposited in a plasma enhanced chemical vapor deposition (PECVD) process. The PECVD process typically results in layers of deposited material that are thicker and wider adjacent to features with steep step boundaries (such as data address line sidewalls 152) than over adjoining portions of the imager surface that are relatively flat or that do not present as steep sidewalls with respect to adjoining portions of the array. For example, for a given deposition thickness of intrinsic silicon layer 126 (i-Si layer 126 is discussed herein as representative of all layers deposited to form photodiode body 125 as it comprises the thickest portion of photodiode body 125) over the surface of imager 100, the thickness of the silicon over steep sidewall segments 152 of relatively thick data lines 150 is greater than the thickness of i-Si layer 126 deposited over the less thick scan lines 140 and less thick FET 130 island structure. For example, typically the thickness of photosensor semiconductive layer 126 in the area defined by the steep sidewalls data lines 150 (that is, the area in which the topography of overlying FET passivation layer 139 corresponds to the underlying steep sidewall topography of data address line 150) is about 0.5 μm thicker than the thickness of the photosensor semiconductive layer 126 in areas over adjoining structures in the array.

The patterning of the photosensitive material layers 124, 126, and 128 to form photodiode bodies 125 is typically accomplished using photolithographic techniques, such as forming a photoresist mask over the imager to protect areas (such as the photodiode bodies) where it is desired that the silicon layers remain, and then etching, such as in a reactive ion etching process, to remove the exposed silicon layers.

Following the etching step that results in formation of photodiode bodies 125, a barrier layer 180 (also referred to as a photodiode passivation layer) is deposited over imager 100. Barrier layer 180 typically comprises an inorganic dielectric material such as silicon oxide or silicon nitride, or combinations of layers thereof. For example, typically barrier layer 180 comprises a layer of silicon nitride deposited in a PECVD process to have a nominal thickness in the range between about 0.2 μm and about 0.5 μm. This layer of dielectric material is important in preventing electrical leakage between device elements, and thus barrier layer 180 needs to be robust, that is, being of high integrity and not having structural flaws that degrade the electrical insulation properties of the layer.

Figure 2:
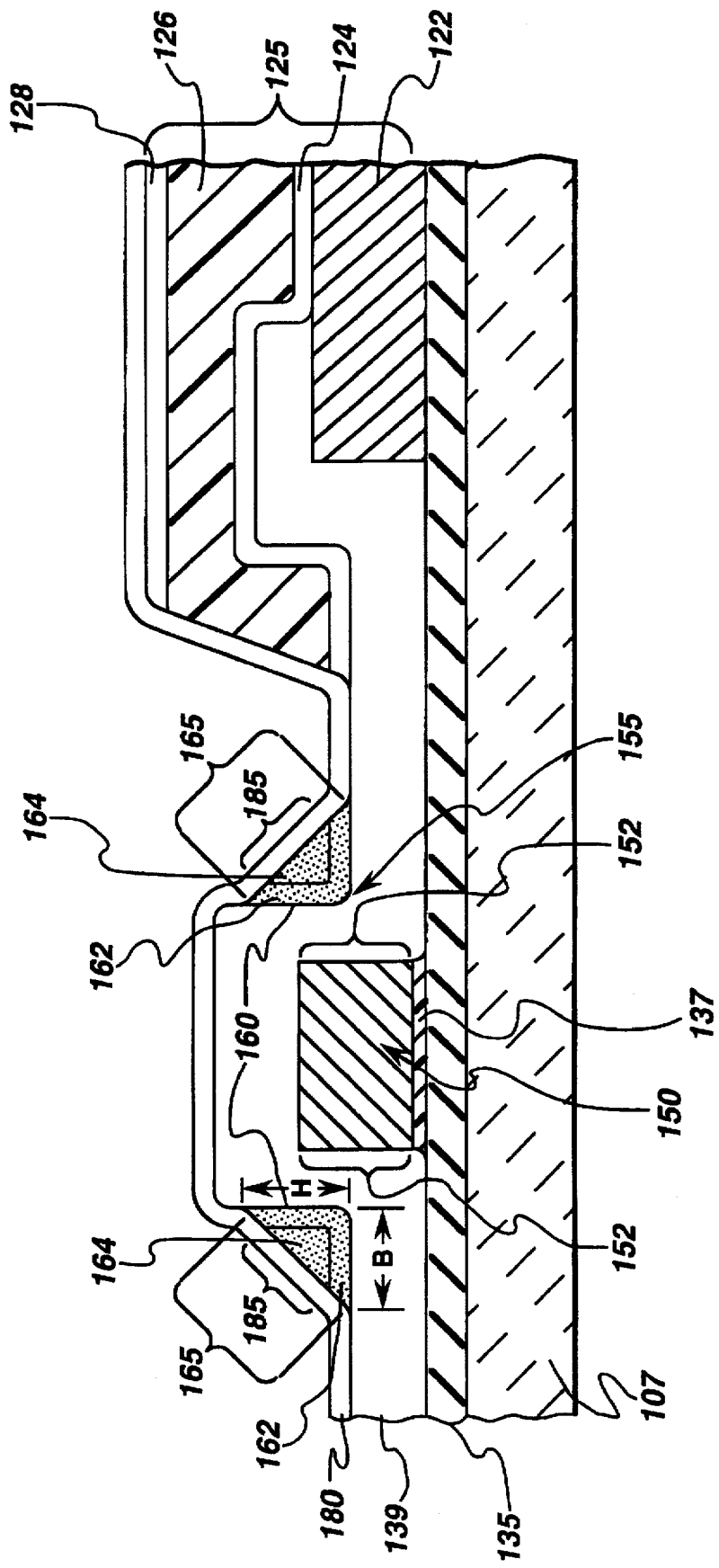
FIG. 2 is a cross-sectional view of, a portion of the array region taken along the lines I—I of FIG. 1(A).

In accordance with this invention, imager 100 further comprises data address line spacers 160 disposed to form an inclined foundation 165 on FET passivation layer 139 in the region of where the topography of passivation layer 139 is defined by the steep sidewalls 152 of underlying data address lines 150 (FIG. 2). Specifically, the topography of interest is the step at the intersection of data address line sidewalls 152 and the structure underlying the data line. Spacers 160 comprise residual photosensor semiconductive material, that is, semiconductive material that was deposited over the array in the vicinity of data address line 150 in the course of formation of photodiode body 125 and which material remains in the region adjacent to data address line sidewalls 152 after the etching steps described above that are used to form photodiode body 125. As used herein, "adjacent to data address line sidewalls" and the like refers to material disposed in a region having a topography corresponding to the step between data line 150 and the underlying array structure, regardless of whether spacer 160 is in intimate physical contact with data line 150 or is in intimate contact with an overlying layer that has a topography corresponding to that of the data line sidewalls 152.

As illustrated in FIG. 2, spacer 160 typically comprises a first spacer layer 162 that comprises residual material from first layer of doped semiconductor material 124, and at least a second spacer layer 164 that comprises residual material from semiconductive material layer 126. Spacer 160 typically appears as illustrated in FIG. 2; spacer 160 can alternatively further comprise residual material from second doped semiconductor layer 128 (not shown on spacer 160 in FIG. 2), although typically the formation process results in the removal of that layer of material from the region adjacent to data address line sidewall segments 152.

Spacer segments 160 remain after the etching step to form photodiode bodies 125. Typically reactive ion etching is used to remove doped silicon layers 124 and 128 and intrinsic silicon layer 126; due to the additional thickness of these silicon layers deposited adjacent to the steep data address line sidewall regions 152 (as discussed above), these silicon layers are not totally etched away during the time that the reactive ion etch removes the less thick portions of the deposited silicon on other areas of imager 100. There is thus a process "window," that is, a time point in the etching process to form the photodiode bodies by removing the silicon from other parts of imager 100, at which deposited silicon layers 124, 126, and 128 are removed from the areas over scan address lines 140 and over FETs 130, but at which time some residual silicon material remains adjacent to data address line sidewall segments 152. The varying depths of i-Si layer 126 (dependent on the underlying topography) and the substantial uniformity of reactive ion etch rates (e.g., approximately +−10%) across imager 100 combine to provide the condition for formation of spacers 160. For example, the additional thickness of silicon layers 124, 126, and 128 adjacent to data line sidewall regions 152 (e.g., about 0.5 μm more than adjoining areas, which is approximately 33% thicker than the thickness of the silicon over the flat areas of the array) provides for the formation of spacers disposed adjacent to data address line sidewalls 152. Even with a substantially uniform etch process, however, the silicon etching can result in a "bullseye" effect in which spacers 160 disposed closer to the center of the array (e.g., the panel of imager 100) have a greater cross-sectional area than spacers disposed closer to the edges of the array. In some situations, the bullseye effect can result in the complete removal of the silicon spacers along data lines near the edge of the array. The silicon etch time is thus desirably selected to provide spacers 160 at least adjacent to a portion of the data address lines disposed in array 105, and desirably adjacent to all data address lines in the array.

The nominal cross-sectional shape of spacer 160 is approximately triangular so as to fill a corner region topography 155 of FET passivation layer 139 that corresponds to the step topography of the underlying steep sidewall segments 152 of data address lines 150. This roughly triangular shape of spacers 160 provide inclined foundation 165 for overlying photosensor barrier layer 180 so that barrier layer 180 has high integrity step segments 185 disposed over inclined foundation 165.

The formation process for spacers 160 as described above results in spacers 160 having dimensions in which base "B" of spacer 160 is approximately one-half the magnitude of the height "H" of data address line sidewall 152. The exact cross-sectional shape of spacers 160 for imager 100 is a function several factors. For example, the PECVD process used in depositing silicon layers 124, 126, and 128, and the exact difference in thickness of the silicon deposited over the varying topography of the imager can affect the shape of spacer 160 (the PECVD process is typically governed by providing a silicon deposition having desired electrical properties as opposed to spacer formation). The underlying topography of address line 150 can also affect the shape of spacer 160; the steepness (that is, closer to substantially vertical) of data address line sidewalls 152 can be affected by the etching process to form the address line, e.g., wet etching for some metals (e.g., molybdenum and aluminum) tends to leave a more vertical sidewall as opposed to other etching processes. The reactive ion etching process to remove the silicon layers 124, 126, 128 to form photodiode body 125 can also affect spacer shape; reactive ion etching is typically anisotropic, that is, directional, providing for spacer formation. Increasing the pressure of an RIE etching process can make the etch more isotropic and hence reduces the size of spacer 160.

Spacers 160 are disposed along the length of each data line 150 and further extend along portions of each data line 150 that protrude to form respective drain electrodes 134 along the data line. The presence of the semiconductive material in spacers 160 along data lines 150 does not lead to increased electrical leakage in the array as it is disposed only adjacent to conductive structures already electrically connected.

Spacers 160 serve to provide sloped foundation 165 so that high integrity step segments 185 of barrier layer 180 adhere to the array with few, if any, significant steps, or sharp changes in the vicinity of data lines 150. Thus the robustness of barrier layer 180 is significantly enhanced with respect to the conventional imager structure, in which barrier layer 180 is typically both thinnest and under the most stress at the base of relatively thick data line 150. This portion of conventional imager barrier layer is susceptible to faster etching of the barrier in both wet and dry etchants and a common point at which breakdown occurs in the barrier layer. Spacers 160 thus reduce stress points in barrier layer 180 and thereby enhance the electrical effectiveness of this dielectric layer and enhance survival of barrier layer 180 during the rest of the imager fabrication processes, during which barrier layer 180 is exposed to both wet and dry etchants. A further benefit of spacers 160 in accordance with this invention is that, because the topography around data address line sidewalls is now sloped, the subsequently deposited common electrode layer (typically comprising indium tin oxide or the like) (not shown) will have a more uniform thickness across imager 100 and thus can be patterned more easily, with less need for overetching to clear the conductive material from areas to be cleared.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A solid state imager comprising:

a plurality of photosensor pixels arranged in rows and columns in a pixel array, each of said photosensor pixels having a photosensor comprising a photosensitive semiconductive material and an associated switching device coupled to said photosensor;

a plurality of data address lines disposed in columns in said array, said data address lines being electrically coupled to respective photosensor switching devices disposed along respective columns;

an upper barrier layer disposed over said pixel array; and a plurality of data address line spacers disposed between said data address line sidewall segments and said barrier layer along at least a portion of said data address lines disposed in said imager, said address line spacers being disposed so as to provide an inclined foundation for said barrier layer in the region of said data address line sidewalls, said data address line spacers comprising residual photosensor semiconductive material.

2. The imager of claim 1 wherein each of said data address lines comprise substantially vertical sidewall segments.

3. The imager of claim 2 wherein said residual photosensor semiconductive material comprises amorphous silicon.

4. The imager of claim 2 wherein each of said photosensors comprises a first doped silicon layer, a substantially intrinsic amorphous silicon (i-Si) layer, and a second doped silicon layer, and said data address line spacers each comprise at least a portion of one of said doped silicon layers and a portion of said i-Si layer.

5. The imager of claim 4 further comprising a switching device passivation layer, said switching device passivation layer being disposed over said data address lines and having a topography corresponding to said sidewalls of the underlying data address lines, and wherein each of said spacers is disposed over said switching device passivation layer adjacent the length of said data address line and adjacent to the portions of said data address line comprising the coupling to respective switching devices coupled to said data address line.

6. The imager of claim 5 wherein each of said spacers comprises residual photosensor semiconductive material having an approximately triangular shape disposed over said switching device passivation layer to provide said inclined foundation for said barrier layer.

7. The imager of claim 6 wherein each of said spacers has a base having a length with a magnitude of about one half the magnitude of the height of the data address line sidewall.

8. The imager of claim 1 wherein said barrier layer comprises a dielectric material selected from the group of inorganic dielectric materials and organic dielectric material.

9. The imager of claim 8 wherein said barrier layer comprises silicon nitride having a thickness in the range between about 0.05 µm and 0.2 µm.

10. The imager of claim 1 wherein each of said data address lines has a thickness between about 0.5 µm and about 1 µm.

* * * * *